US 8,316,286 B2

(12) United States Patent
Lee et al.

(10) Patent No.: US 8,316,286 B2
(45) Date of Patent: Nov. 20, 2012

(54) SYSTEM AND METHOD FOR RATE MATCHING TO ENHANCE SYSTEM THROUGHPUT BASED ON PACKET SIZE

(75) Inventors: Jung Woon Lee, Allen, TX (US);
Shiau-He Tsai, San Diego, CA (US);
Anthony C. K. Soong, Plano, TX (US)

(73) Assignee: FutureWei Technologies, Inc., Plano, TX (US)

( * ) Notice: Subject to any disclaimer, the term of this patent is extended or adjusted under 35 U.S.C. 154(b) by 602 days.

(21) Appl. No.: 12/554,742

(22) Filed: Sep. 4, 2009

(65) Prior Publication Data
US 2010/0058136 A1     Mar. 4, 2010

Related U.S. Application Data

(60) Provisional application No. 61/094,186, filed on Sep. 4, 2008.

(51) Int. Cl.
*H03M 13/03*     (2006.01)
(52) U.S. Cl. ...................................................... 714/790
(58) Field of Classification Search .................. 714/748, 714/790
See application file for complete search history.

(56) References Cited

U.S. PATENT DOCUMENTS

| 7,093,184 | B2 * | 8/2006 | Kim et al. | 714/789 |
| 7,293,217 | B2 * | 11/2007 | Pietraski et al. | 714/755 |
| 7,620,872 | B2 * | 11/2009 | Kwon et al. | 714/751 |
| 7,865,813 | B2 * | 1/2011 | Spencer et al. | 714/790 |
| 2006/0251001 | A1 | 11/2006 | Yun et al. | |
| 2008/0090517 | A1 | 4/2008 | Cheng | |
| 2008/0178064 | A1 | 7/2008 | Kim et al. | |
| 2009/0238066 | A1 * | 9/2009 | Cheng | 370/216 |
| 2010/0195662 | A1 * | 8/2010 | Kang et al. | 370/412 |

OTHER PUBLICATIONS

"Part 16: Air Interface for Fixed Broadband Wireless Access Systems," IEEE Standard for Local and Metropolitan Area Networks, IEEE Std 802.16™, Oct. 1, 2004, 895 pages.

"3rd Generation Partnership Project; Technical Specification Group Radio Access Network; Evolved Universal Terrestrial Radio Access (E-UTRA); Multiplexing and Channel Coding (Release 8)," 3GPP TS 36.212, V8.3.0, May 2008, 48 pages.

* cited by examiner

*Primary Examiner* — James C Kerveros
(74) *Attorney, Agent, or Firm* — Slater & Matsil, L.L.P.

(57) ABSTRACT

A system and method for rate matching to enhance system throughput based on packet size is provided. A method for transmitting information includes encoding a block of N bits, where N is an integer, demultiplexing the encoded block of N bits into at least one subblock of systematic bits and at least one subblock of parity bits, and permuting the at least one subblock of systematic bits and the at least one subblock of parity bits to generate at least one permuted subblock. The method also includes forming at least one output block from the at least one permuted subblock, computing a starting position of a redundancy version for a hybrid automatic repeat request (HARQ) transmission based on a relationship between N and a threshold, and transmitting the redundancy version. The redundancy version begins at the computed starting position and ends when a specified number of bits has been transmitted.

20 Claims, 7 Drawing Sheets

SYSTEM AND METHOD FOR RATE MATCHING TO ENHANCE SYSTEM THROUGHPUT BASED ON PACKET SIZE

This application claims the benefit of U.S. Provisional Application No. 61/094,186, filed on Sep. 4, 2008, entitled "Rate Matching Method Enhancing System Throughput Using Definition Change of Redundancy Version According to Encoding Packet Size," which application is hereby incorporated herein by reference.

TECHNICAL FIELD

The present invention relates generally to wireless communications, and more particularly to a system and method for rate matching to enhance system throughput based on packet size.

BACKGROUND

The increasing demand for high data-rate wireless service has motivated various standards bodies, such as the Third Generation Partnership Project 2 (3GPP2), the Third Generation Partnership Project (3GPP), the Institute of Electrical and Electronics Engineers (IEEE 802.16), and so forth, to develop various wireless systems supporting faster data-rate, higher spectral efficiency and more reliable communication. These standards bodies have developed wireless systems, such as ultra mobile broadband (UMB), Long Term Evolution (LTE), LTE-Advanced, wireless metropolitan area networks (MAN), and so on. In these standards and others, turbo code is a key technology of forward error correction (FEC) in high data-rate packet service.

Generally, a turbo code consists of two or more constituent encoders. Also, to provide more reliable data service, hybrid automatic repeat request (HARM) operation is carried out with FEC. For example, in a LTE downlink (DL), an asynchronous HARQ operation is considered and four (4) redundancy versions are generated for HARQ transmission in the rate matching block. Therefore, at a given resource size, a number of coded bits to be transmitted is determined and a redundancy version of packet should be prepared accordingly.

Generally, different applications and services operating in a wireless system may have a different preferred packet size. For example, low latency services may prefer a small packet size, while high throughput services may prefer a large packet size. Typically, with the same code rate, different packet sizes may result in different wireless system performance. Therefore, a different number of coded bits may be used for different packet sizes to optimize wireless system performance.

SUMMARY OF THE INVENTION

These and other problems are generally solved or circumvented, and technical advantages are generally achieved, by embodiments of a system and method for dynamically assigning persistent resources in a wireless communications system.

In accordance with an embodiment, a method for transmitting information is provided. The method includes encoding a block of N bits, where N is an integer value, demultiplexing the encoded block of N bits into at least one subblock of systematic bits and at least one subblock of parity bits, and permuting the at least one subblock of systematic bits and the at least one subblock of parity bits to generate at least one permuted subblock. The method also includes forming at least one output block from the at least one permuted subblock, computing a starting position of a redundancy version for a hybrid automatic repeat request (HARM) transmission, and transmitting the redundancy version. The computing is based on a relationship between N and a threshold, and the redundancy version begins at the computed starting position of the at least one output block and ends when a specified number of bits has been transmitted.

In accordance with another embodiment, a method for transmitting information is provided. The method includes encoding a first block of N bits received from a data input, thereby producing a first plurality of systematic bits, a first plurality of first parity bits, and a first plurality of second parity bits, with N being an integer value. The method also includes demultiplexing the encoded first block of N bits into a first subblock of systematic bits, a first subblock of first parity bits, and a first subblock of second parity bits, and permuting the first subblock of systematic bits, the first subblock of first parity bits, and the first subblock of second parity bits to generate a first permuted subblock. The method further includes generating a first output block from the first permuted subblock, setting a first starting position of a first redundancy version for a hybrid automatic repeat request (HARQ) transmission to enable a skipping of at least one of the first systematic bits in response to determining that N is greater than a threshold, setting the first starting position of the first redundancy version for the HARQ transmission to not enable a skipping of any of the first systematic bits in response to determining that N is less than the threshold, and transmitting the first redundancy version by outputting at least a portion of the first output block starting at the first starting position.

In accordance with another embodiment, a transmitter is provided. The transmitter includes a segmentation unit coupled to a data input, a turbo encoder coupled to the segmentation unit, a rate matching unit coupled to the turbo encoder, a signal processing unit coupled to the rate matching unit, and a radio frequency circuit coupled to the signal processing unit. The segmentation unit generates data blocks of size N from data provided by the data input, where N is an integer value. The turbo encoder encodes a data block of size N to produce a plurality of systematic bits and a plurality of parity bits, the rate matching unit permutes the encoded data block of size N, forms an output block from the permuted and encoded data block of size N, and outputs the output block, where the outputted output block starts at a starting position based on a relationship between N and a threshold. The signal processing unit modulates the outputted output block, and the radio frequency circuit performs analog signal processing on the signal processed and outputted output block to prepare the signal processed and outputted output block for over-the-air transmission.

An advantage of an embodiment is that system performance may be optimized based on a relationship between block size and a threshold, wherein the threshold is based on a turbo encoder's code rate. This may improve the performance of services utilizing large blocks as well as services utilizing small blocks.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a wireless system compliant to the LTE or Wireless MAN technical standards. The embodiments may also be applicable to wireless systems that make use of turbo encoding and supports different block sizes.

Figure 1:
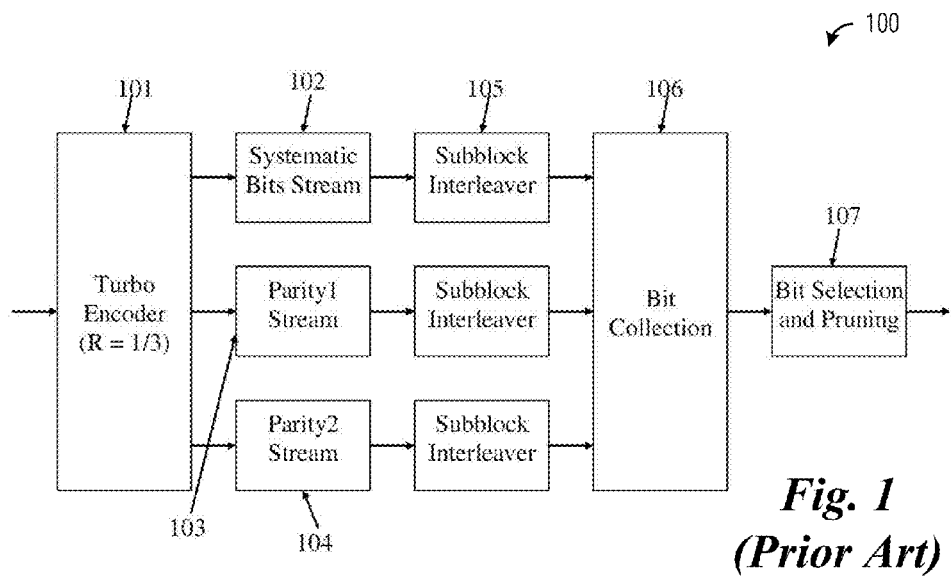
FIG. 1 is a diagram of a prior art rate matching block used in a LTE wireless system.

FIG. 1 illustrates a prior art rate matching block 100 used in a LTE wireless system. First, an input code block provided by a signal input to rate matching block 100 is encoded by turbo encoder 101 whose code rate is ⅓. Turbo encoder 101 has two constituent recursive convolutional encoders. Coded bits produced by turbo encoder 101 may be split into three (3) streams: Systematic bits stream 102; Parity1 stream 103; and Parity2 stream 104. Systematic bits stream 102 may correspond to input bits, Parity1 stream 103 may be generated by a first constituent encoder, and Parity2 stream 104 may be generated by a second constituent encoder. Next, the three streams (Systematic bits stream 102, Parity1 stream 103, and Parity2 stream 104) may be interleaved by Subblock Interleaver 105. There may be three (3) subblock interleavers, one for each stream.

Output from the three subblock interleavers 105 may be concatenated in bit collection unit 106 and a redundancy version (RV) may be generated in bit selection and pruning unit 107. The operation of bit collection unit 106 and bit selection and pruning unit 107 may be implemented by way of a circular buffer.

Figure 2:
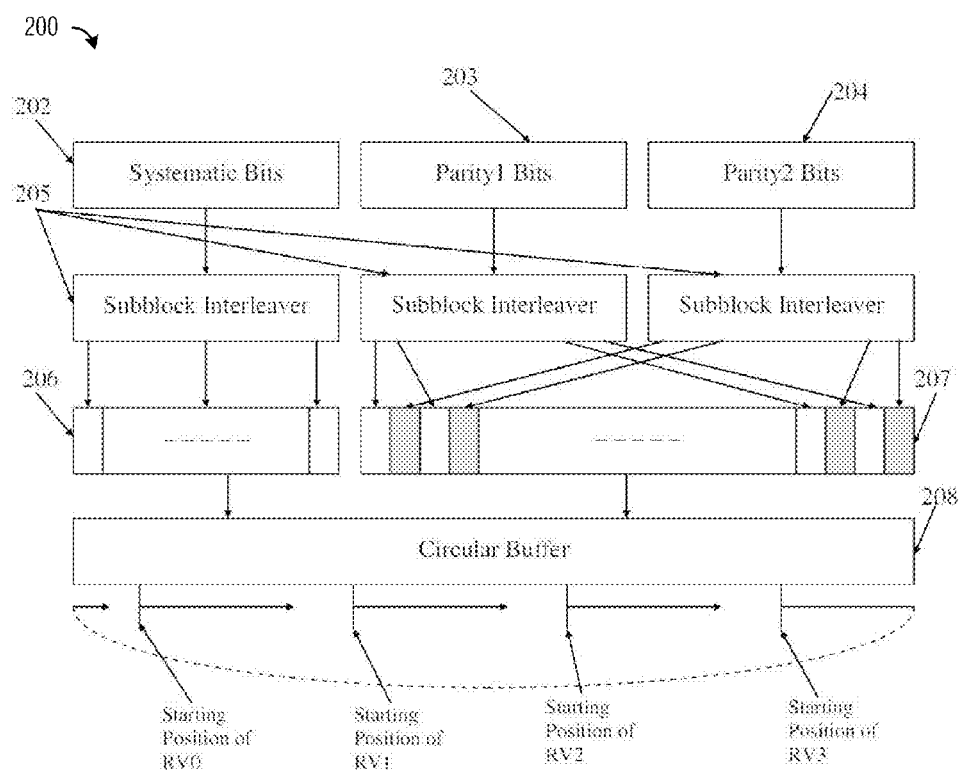
FIG. 2 is a diagram of a rate matching operation, wherein the rate matching operation makes use of a circular buffer.

FIG. 2 illustrates a rate matching operation 200, wherein rate matching operation 200 makes use of a circular buffer. First, an output of turbo encoder, such as turbo encoder 101, may be split into three streams (systematic bits stream 202, Parity1 stream 203, and Parity2 stream 204). Each of the three streams may interleaved separately by one of three subblock interleavers 205.

An output of subblock interleaver 205 used to interleave systematic bit stream 202 (also referred to as interleaved systematic bits stream 206) may be written into a circular buffer 208 in sequence, with a first bit of interleaved systematic bit stream 206 stored at the beginning of circular buffer 208. An output of subblock interleavers 205 used to interleave Parity1 stream 203 and Parity2 stream 204 may be interlaced together in a bit-by-bit fashion (also referred to as interleaved and interlaced parity bit stream 207). Interleaved and interlaced parity bit stream 207 may be written into circular buffer 208 in sequential order, with a first bit of interleaved and interlaced parity bit stream 207 next to a last bit of interleaved systematic bits stream 206.

Interleaved systematic bits stream 206 and interleaved and interlaced parity bit stream 207 form circular buffer 208, which may be a virtual circular buffer. Circular buffer 208 may be generated as follows:

$$w_k = v_k^{(0)} \text{ for } k=0, \ldots, k_\pi-1,$$

$$w_{k_\pi+2k} = v_k^{(1)} \text{ for } k=0, \ldots, k_\pi-1,$$

$$w_{k_\pi+2k+1} = v_k^{(2)} \text{ for } k=0, \ldots, k_\pi-1,$$

where $k_\pi$ is the subblock interleaver size, $v_k^{(0)}$ is the interleaved systematic bits, and $v_k^{(1)}$ and $v_k^{(1)}$ are the outputs of subblock interleavers 205 used to interleave Parity1 stream 203 and Parity2 stream 204, respectively.

According to LTE technical specifications, four redundancy versions (RV) may be defined. Each RV may specify a starting bit index in circular buffer 208. A transmitter may choose one RV for each HARQ transmission. The transmitter may then read a block of coded bits from circular buffer 208 starting at the starting bit index specified by a chosen RV. If the transmitter reaches the end of circular buffer 208 before completing the block of coded bits needed for transmission, the transmitter may wrap around and continue at the beginning of circular buffer 208, hence the name "circular buffer."

Let a bit index of a first bit in circular buffer 208 be bit index zero (0), a starting position of RV $rv_{idx}$ (which may be equal to 0, 1, 2, or 3) may be specified as:

$$k_0 = R_{subblock}^{TC} \left( 2 \left\lceil \frac{N_{cb}}{8 R_{subblock}^{TC}} \right\rceil \cdot rv_{idx} + 2 \right),$$

where $N_{cb}$ is the size of circular buffer 208 (i.e., the number of systematic bits and parity bits), and $R_{subblock}^{TC}$ is the number of rows of subblock interleaver 205. For example, when $rv_{idx}=0$ is used, 1/16 puncturing of bits in systematic bits stream 202 is achieved if the code bit selection (reading from circular buffer 208) does not reach the end of circular buffer 208 and wraps around.

The reason that starting point of $rv_{idx}=0$ is not started from bit index zero is that in a turbo code with a well designed interleaver, the parity bits are the main contributors to the Hamming weight of minimum distance. Excessive puncturing of parity bits causes a reduction in the effective minimum distance of the punctured code. Then, at higher coding rates, since the number of parity bits is relatively small compared to systematic bits, the performance degradation would be significant if only parity bits are punctured to generate the required code rate.

In a LTE wireless system, a turbo encoder has a single input stream while a Wireless MAN system employs the double binary turbo code with a code rate of ⅓. In a ⅓ double binary turbo code, there may be two input streams and from the two input streams, four (4) parity bit streams are generated.

Figure 3:
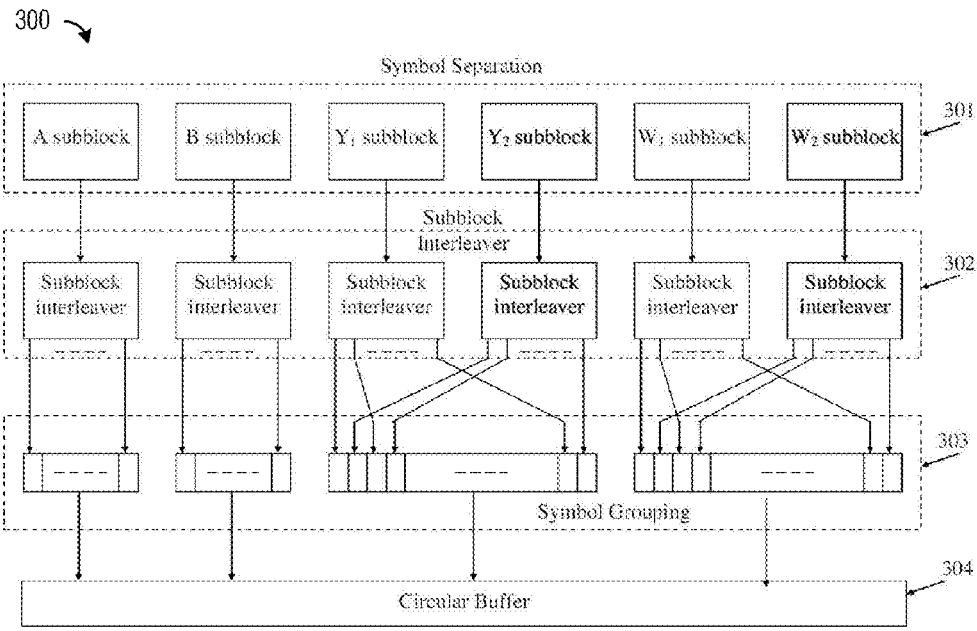
FIG. 3 is a diagram of a rate matching operation in a Wireless MAN system, wherein the rate matching operation makes use of a circular buffer.

FIG. 3 illustrates a rate matching operation 300 in a Wireless MAN system, wherein rate matching operation 300 makes use of a circular buffer. Output of a double binary turbo code (turbo encoder) may be demultiplexed into six bit streams denoted A, B, $Y_1$, $Y_2$, $W_1$, and $W_2$ in a symbol separation block 301. Subblocks A and B may refer to two information blocks, while subblocks $Y_1$, $Y_2$, $W_1$, and $W_2$ may refer to four parity blocks.

The six subblocks may then be interleaved in subblock interleaver 302, wherein each of the six subblocks may be individually interleaved by a separate subblock interleaver. In a symbol grouping block 303, subblock interleaved bit streams A and B may be by-passed, while subblock interleaved bit streams $Y_1$ and $Y_2$ may be multiplexed and subblock interleaved bit streams $W_1$ and $W_2$ may be multiplexed. An output order of symbol grouping block 303 may be interleaved A and B bit streams followed by a symbol-by-symbol multiplexed sequence of interleaved $Y_1$ and $Y_2$ bit streams, followed by a symbol-by-symbol multiplexed sequence of interleaved $W_1$ and $W_2$ bit streams.

The symbol-by-symbol multiplexed sequence of interleaved $Y_1$ and $Y_2$ bit streams may consist of a first output bit from the $Y_1$ bit stream's subblock interleaver, the first output bit from the $Y_2$ bit stream's subblock interleaver, the second output bit from the $Y_1$ bit stream's subblock interleaver, the second output bit from the $Y_2$ bit stream's subblock interleaver, and so on. The symbol-by-symbol multiplexed sequence of interleaved $W_1$ and $W_2$ bit streams may consist of the first output bit from the $W_1$ bit stream's subblock interleaver, the first output bit from the $W_2$ bit stream's subblock interleaver, the second output bit from the $W_1$ bit stream's subblock interleaver, the second output bit from the $W_2$ bit stream's subblock interleaver, and so on.

In the Wireless MAN system, after symbol grouping block 303, the interleaved symbols form virtually a circular buffer 304 and the mother codeword is punctured to generate a subpacket with various coding rates and the subpacket is also used as hybrid automatic repeat request (HARQ) packet transmission. The starting position of each subpacket for HARQ may be set to $$k_0 = (SPID_i \cdot L_i) \bmod (3N),$$

where $SPID_i$ is the subpacket identifier (ID) for an i-th subpacket, $L_i$ is the number of coded bits to be transmitted in the i-th subpacket, and N is the block size (also referred to as the number of bits in encoder input. For a first subpacket, $SPID_0=0$). In the Wireless MAN system (unlike in an LTE wireless system), the systematic bit stream is not punctured in a first HARQ transmission.

Figure 4:
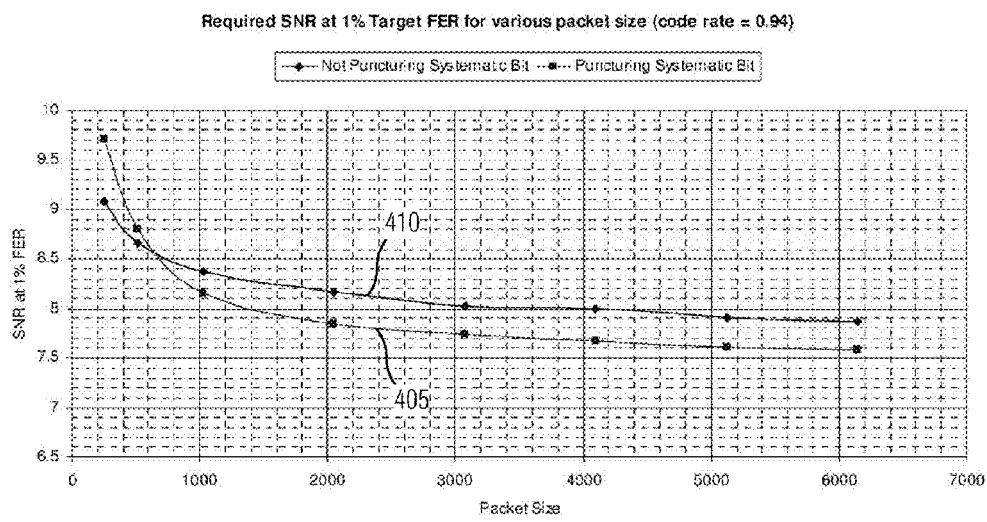
FIG. 4 is a data plot of packet size versus target signal-to-noise ratio (SNR) for two wireless systems using turbo coding.

FIG. 4 illustrates a data plot of packet size versus target signal-to-noise ratio (SNR) for two wireless systems using turbo coding. A first trace 405 illustrates packet size versus target SNR for a first wireless system where both systematic bits and parity bits are punctured and a second trace 410 illustrates packet size versus target SNR for a second wireless system (punctures both systematic and parity bits) where only parity bits are punctured. As shown in FIG. 4, at larger packet sizes, the first wireless system provides better performance than the second wireless system (punctures only parity bits). However, at smaller packet sizes, the first wireless system provides worse performance than the second wireless system.

In next generation wireless systems, voice-over-Internet-Protocol (VoIP) may be one of the most important services and it uses a small packet size. Therefore, if channel coding punctures the systematic bits in addition to the parity bits to small packet sizes, then the performance of services making use of small packet sizes, such as VoIP, may be reduced.

Figure 5:
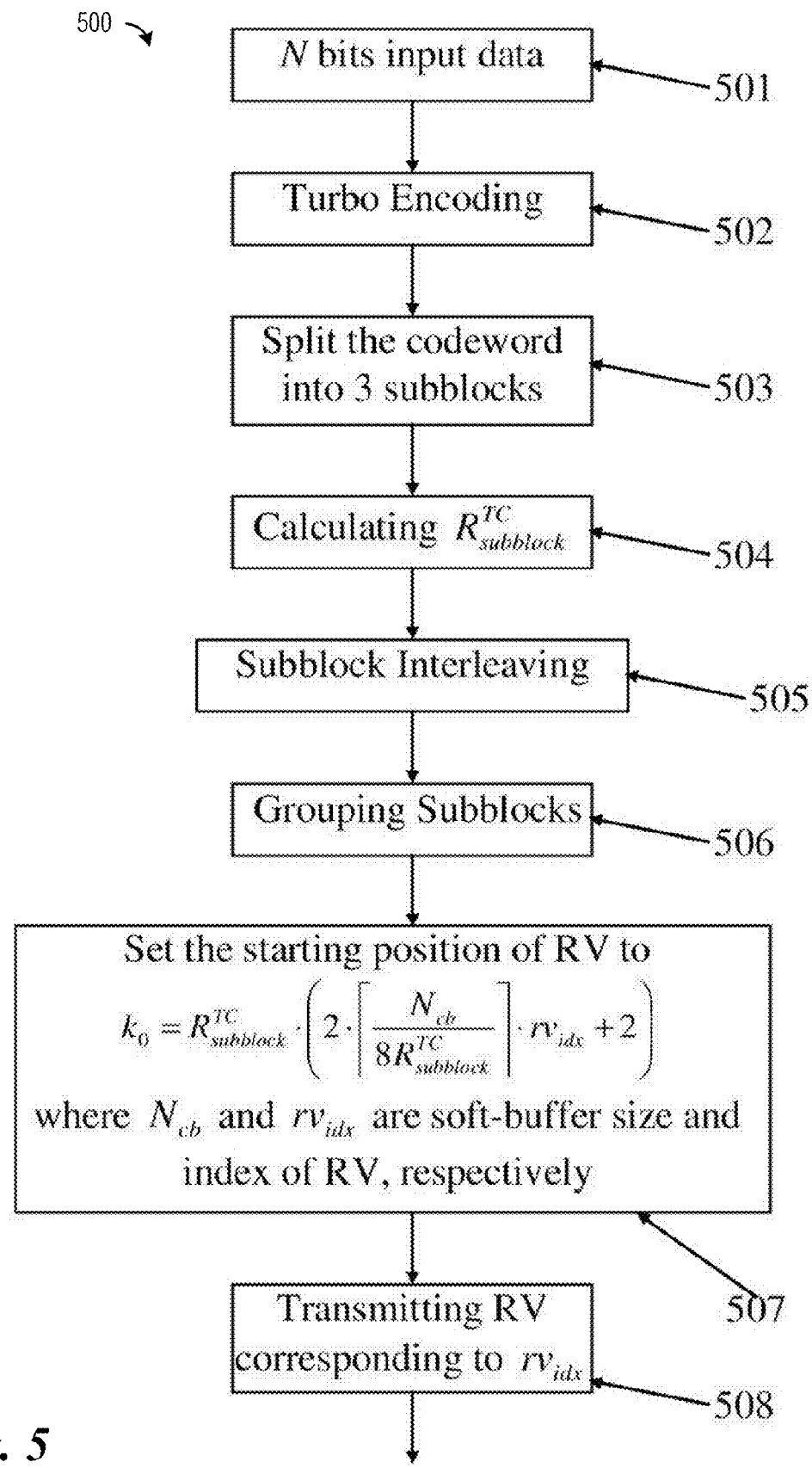
FIG. 5 is a flow diagram of operations in a channel coding process in a LTE wireless system.

FIG. 5 illustrates a flow diagram of operations 500 in a channel coding process in a LTE wireless system. Operations 500 may begin with N bits of input data arriving at a turbo encoder, wherein N is the size of a block of data (block 501). The N bits of input data may then be encoded by the turbo encoder (block 502) and subsequently split into three (3) subblocks (block 503). As discussed previously, the encoded N bits of input data may be split into a systematic bit stream and a Parity1 bit stream and a Parity2 bit stream.

Operations 500 may then continue with the calculating of a number of rows in a subblock interleaver, $R_{subblock}^{TC}$ (block 504) and interleaving each of the bit streams (block 505). The interleaved subblocks may also be concatenated and grouped (block 506). With the interleaved subblocks concatenated and grouped, a starting position of RV may be calculated using an expression:

$$k_0 = R_{subblock}^{TC}\left(2\left\lceil\frac{N_{cb}}{8R_{subblock}^{TC}}\right\rceil \cdot rv_{idx} + 2\right),$$

where $N_{cb}$ is the size of a buffer used to store the interleaved and concatenated subblocks, $R_{subblock}^{TC}$ is the number of rows of subblock interleaver 205, and $rv_{idx}$ (which may be equal to 0, 1, 2, or 3) is the index of RV (block 507). The RV may then be transmitted according to the given index of RV (block 508).

Figure 6:
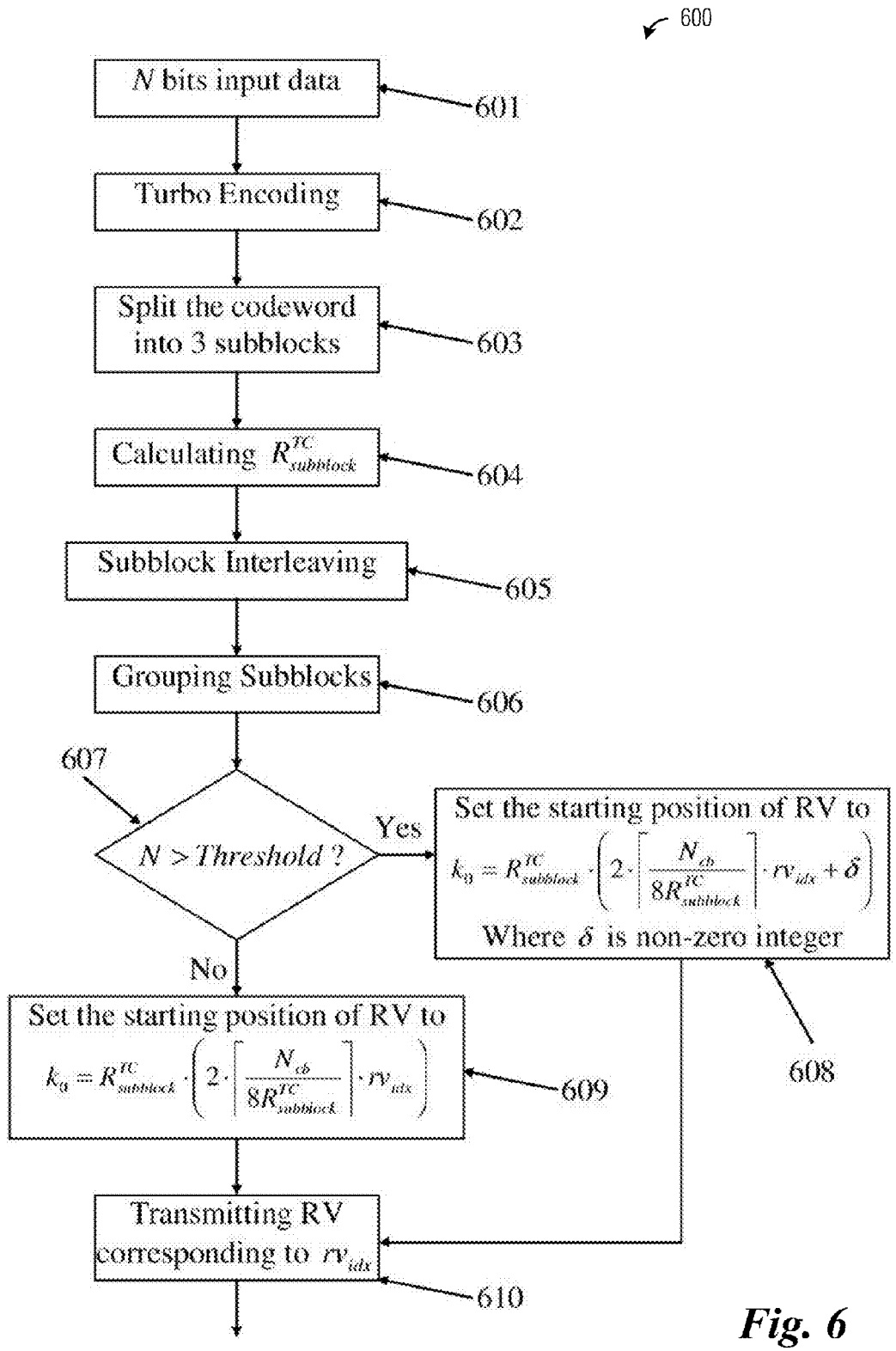
FIG. 6 is a flow diagram of operations in a channel coding process in a LTE wireless system, wherein a starting position of a RV is set based on a block size.

FIG. 6 illustrates a flow diagram of operations 600 in a channel coding process in a LTE wireless system, wherein a starting position of a RV is set based on a block size. Operations 600 may begin with N bits of input data arriving at a turbo encoder, wherein N is the size of a block of data, i.e., block size (block 601). The N bits of input data may then be encoded by the turbo encoder (block 602) and subsequently split into three (3) subblocks (block 603).

Operations 600 may then continue with the calculating of a number of rows in a subblock interleaver, $R_{subblock}^{TC}$ (block 604) and interleaving each of the bit streams (block 605). The interleaved subblocks may also be concatenated and grouped (block 606). With the interleaved subblocks concatenated and grouped, a starting position of RV may be determined based on the value of the block size N.

The block size N may be compared with threshold (block 607). The block size N may also be referred to as $N_{EP}$ or the number of bits in encoder input (i.e., the number of information bits). The threshold may be determined based on a coding rate or channel condition. The threshold may also be predetermined using techniques including simulation studies of the LTE wireless system (based on specified code rate, and other LTE wireless system parameters), analytical analysis of the LTE wireless system, and so forth. The threshold may be precomputed and then stored for subsequent use.

If the block size N is larger than the threshold, then a starting position of RV may be set using expression:

$$k_0 = R_{subblock}^{TC}\left(2\left\lceil\frac{N_{cb}}{8R_{subblock}^{TC}}\right\rceil \cdot rv_{idx} + \delta\right),$$

where δ is a non-zero integer value (block 608).

If the block size N is not larger than the threshold, then a starting position of RV may be set using expression:

$$k_0 = R_{subblock}^{TC}\left(2\left\lceil\frac{N_{cb}}{8R_{subblock}^{TC}}\right\rceil \cdot rv_{idx}\right),$$

(block 609).

The RV may then be transmitted according to the given index of RV (block 610).

Figure 7:
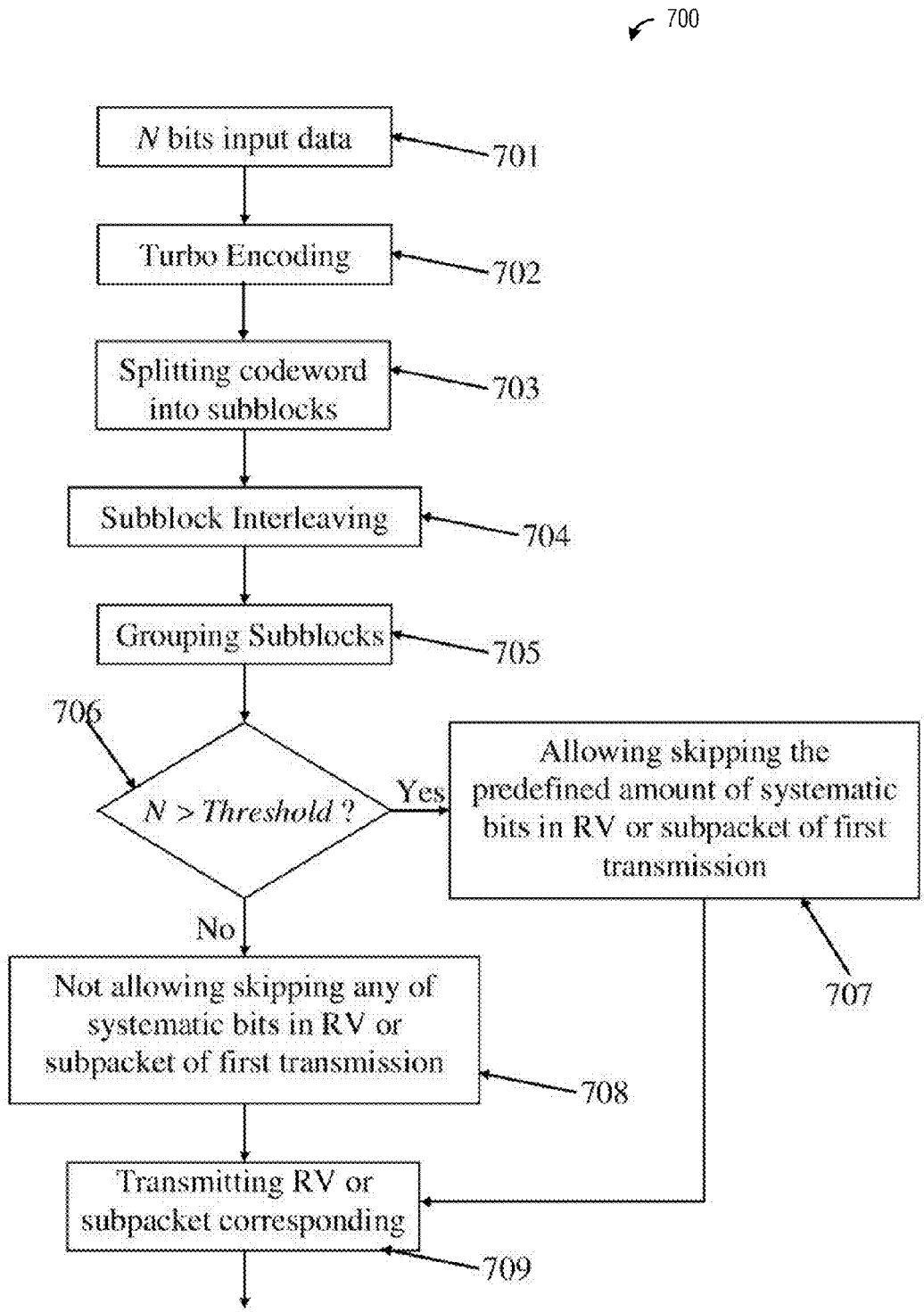
FIG. 7 is a flow diagram of operations in a channel coding process in a wireless system, wherein a starting position of a RV is set based on a block size.

FIG. 7 illustrates a flow diagram of operations 700 in a channel coding process in a wireless system, wherein a starting position of a RV is set based on a block size. Operations 700 may begin with N bits of input data arriving at a turbo encoder, wherein N is the size of a block of data (block 701). The N bits of input data may then be encoded by the turbo encoder (block 702) and subsequently split into a number of subblocks (block 703).

Operations 700 may then continue with the interleaving each of the bit streams (block 704). The interleaved subblocks may also be concatenated and grouped (block 705). With the interleaved subblocks concatenated and grouped, a starting position of RV may be determined based on the value of the block size N.

The block size N may be compared with threshold (block 706). The threshold may be determined based on a coding rate or channel condition. The threshold may also be predetermined using techniques including simulation studies of the LTE wireless system (based on specified code rate, and other LTE wireless system parameters), analytical analysis of the LTE wireless system, and so forth. The threshold may be precomputed and then stored for subsequent use.

If the block size N is larger than the threshold, then a predetermined number of systematic bits in RV or a subpacket of a first HARQ transmission may be skipped (block 707). If the block size N is not larger than the threshold, then no skipping of a predetermined number of systematic bits in RV or subpackets of a first HARQ transmission is allowed (block 708). The RV or subpacket of a first HARQ transmission may then be transmitted according to the given index of RV (block 709).

In Wireless MAN, a double binary turbo code with two systematic streams is used. A bit from each bit stream forms a bit pair that is fed into the double binary turbo code encoder. The prior art rate matching operations discussed in FIG. 3 may be employed with the embodiments to develop a Wireless MAN channel coding procedure. According to the embodiments, since systematic bits starting from a first position in a circular buffer may be punctured for a subpacket of a first HARQ transmission, only bits of a first bit stream (of the two bit streams) may be skipped if the prior art rate matching operations in FIG. 3 are used.

Figure 8:
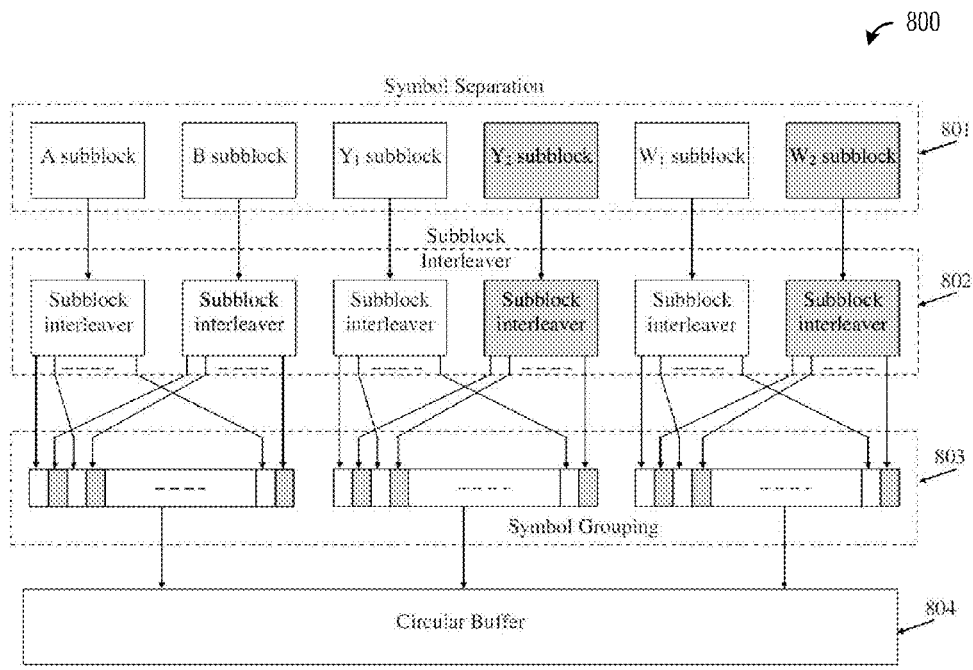
FIG. 8 is a diagram of a rate matching operation in a Wireless MAN system, wherein the skipping of only one bit stream of systematic bits is avoided.

FIG. 8 illustrates a rate matching operation 800 in a Wireless MAN system, wherein the skipping of only one bit stream of systematic bits is avoided. As shown in FIG. 8, turbo encoded symbols may be demultiplexed into six subblocks denoted A, B, $Y_1$, $Y_2$, $W_1$, and $W_2$ in symbol separation block 801. Subblocks A and B are information blocks, while subblocks $Y_1$, $Y_2$, $W_1$, and $W_2$ are parity blocks. The subblocks may then be separately interleaved in subblock interleaver 802, with a separate interleaver for each subblock. A symbol grouping block 803, subblock-interleaved versions of subblocks A and B may be interlaced bit-by-bit, similarly, subblock-interleaved versions of subblocks $Y_1$ and $Y_2$ and subblock-interleaved versions of subblocks $W_1$ and $W_2$ may also be interlaced bit-by-bit. After symbol grouping block 803, the interleaved symbols may form a virtual circular buffer 804.

Since one bit from each of the two systematic bit streams is used to form a bit pair that is subsequently fed into the turbo encoder, both bits of an input bit pair are punctured in rate matching operation 800.

Figure 9:
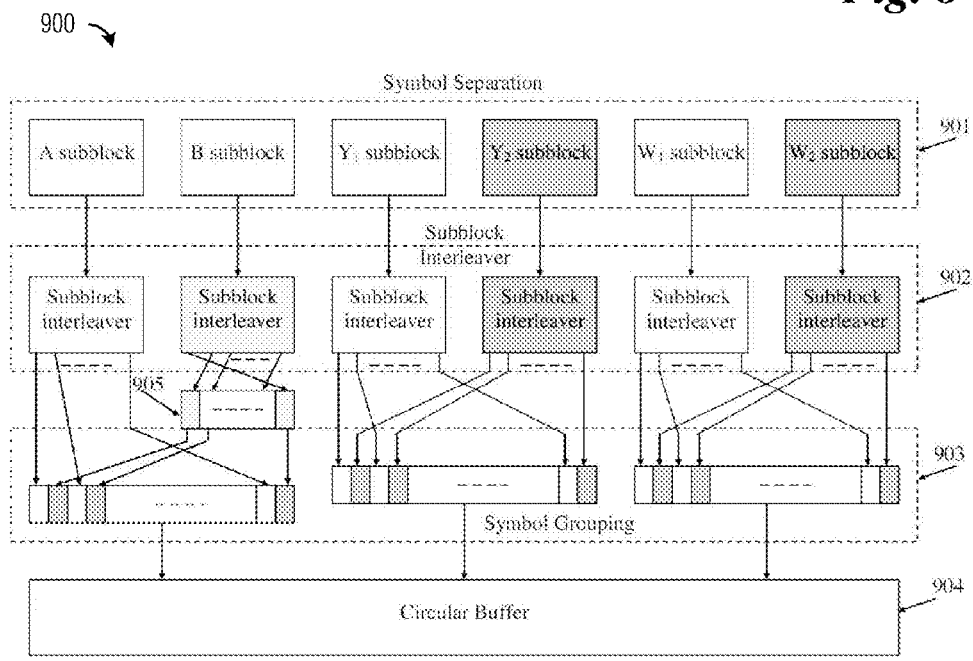
FIG. 9 is a diagram of a rate matching operation in a Wireless MAN system, wherein rate matching operation avoids issues associated with the skipping of only one bit of the bit pair or both bits of the bit pair.

FIG. 9 illustrates a rate matching operation 900 in a Wireless MAN system, wherein rate matching operation 900 avoids issues that occur in rate matching operations 300 and 800, where either only one bit of the bit pair (for example, bits from subblock A) are skipped or both bits of the bit pair are skipped simultaneously.

As with rate matching operation 800, in rate matching operation 900, turbo encoded symbols may be demultiplexed into six subblocks denoted A, B, $Y_1$, $Y_2$, $W_1$, and $W_2$ in symbol separation block 901. Subblocks A and B are information blocks, while subblocks $Y_1$, $Y_2$, $W_1$, and $W_2$ are parity blocks. The subblocks may then be separately interleaved in subblock interleaver 902, with a separate interleaver for each subblock.

In symbol grouping block 903, the subblock-interleaved version of subblock B may be further permuted (shown as group 905). The permutation of subblock-interleaved version of subblock B may be equivalent to a left or right circular bit shift. Preferably, the amount of bit shifting may be at least half of the number of systematic bits to be skipped in a first HARQ transmission if skipping is required. This may mean that the input packet size of the turbo encoder is larger than the threshold (block 706 of FIG. 7). Then, the subblock-interleaved version of subblock A and the further permuted version of subblock B may be interlaced bit-by-bit while the subblock-interleaved versions of subblocks $Y_1$ and $Y_2$ and subblock-interleaved versions of subblocks $W_1$ and $W_2$ may also be interlaced bit-by-bit. After symbol grouping block 903, the interleaved symbols may form a virtual circular buffer 904. The mother codeword may be punctured to generate a subpacket at a desired coding rate and the subpacket may also be used as a HARQ packet transmission.

When the rate matching operations shown in FIGS. 3, 8, and 9 are applied to the Wireless MAN system by incorporating operations 700 in a channel coding process shown in FIG. 7, a starting position of each subpacket for HARQ transmission may be set to $$k_0 = (SPID_i \cdot L_i) \bmod (3N)$$

if the turbo encoder input size is smaller than the threshold. Otherwise, the starting position of each subpacket for HARQ transmission may be set to $$k_0 = (SPID_i \cdot L_i + \delta) \bmod (3N),$$

where δ is a non-zero integer value and some systematic bits are skipped in a first HARQ transmission.

Although FIGS. 3, 8, and 9 illustrate rate matching operations for use with a Wireless MAN system with two streams of N bit long subblocks separated into six bit streams, the rate matching operations may also be used with one stream of N bit long subblocks that is subsequently separated into three bit streams, i.e., for use with a LTE wireless system. For example, circuitry associated with the processing of one of the two streams of N bit long subblocks may be deactivated. This may leave circuitry associated with the processing of only one stream of N bit long subblocks active, thereby producing encoded data suitable for use with a LTE wireless system.

Figure 10:
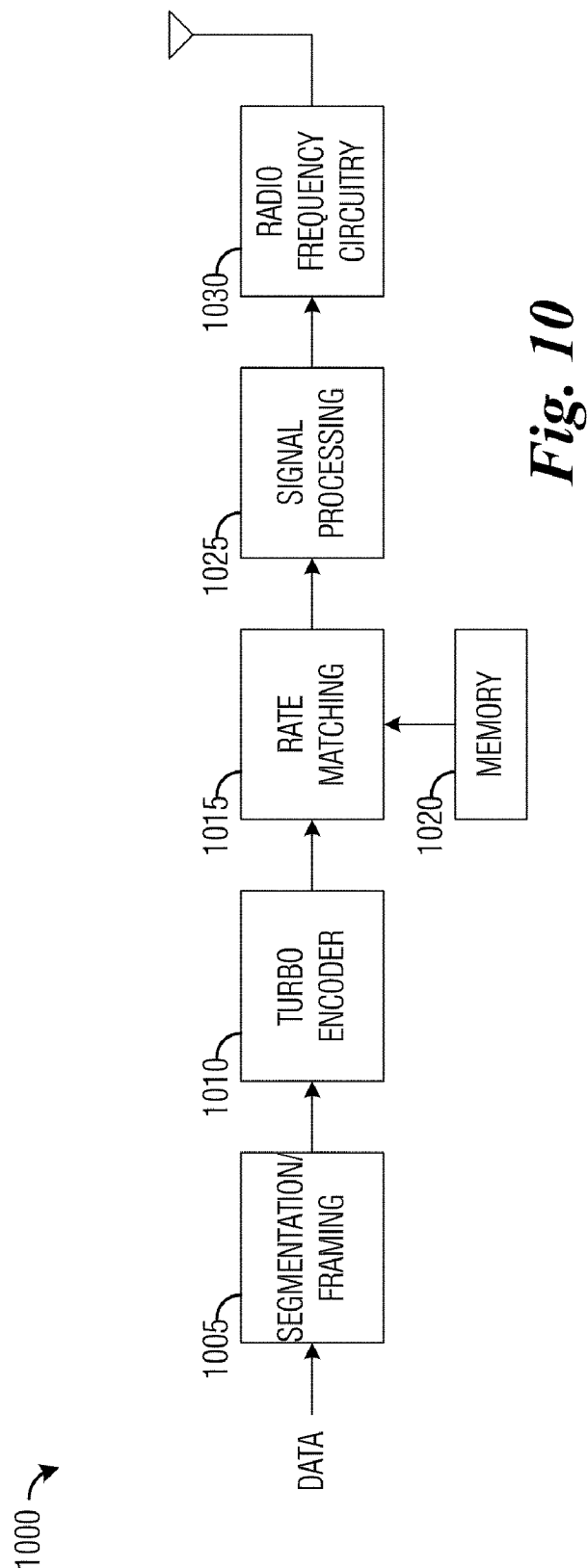
FIG. 10 is a block diagram of a transmitter.

FIG. 10 illustrates a block diagram of a transmitter 1000. Transmitter 1000 includes a segmentation/framing unit 1005 that may be used to assemble data to be transmitted into N bit long subblocks. The N bit long subblocks may then be provided to a turbo encoder 1010 that may be used to apply a turbo code to each of the N bit long subblocks, producing encoded data. Although the discussion focuses on a single data input being converted into a single stream of N bit long subblocks, such as in an LTE wireless system, transmitter 1000 may be readily modified to operate in a Wireless MAN system with two N bit long subblock streams. Therefore, the focus on a single stream of N bit long subblocks should not considered as being limiting to either the scope or spirit of the embodiments.

The encoded data produced by turbo encoder 1010 may be provided to a rate matching unit 1015. Rate matching unit 1015 may be used to perform symbol separation, subblock interleaving, symbol grouping, bit puncturing, encoded data output and so forth. Some of the operations performed by rate matching unit 1015 (such as bit puncturing and encoded data output) may be based on the value of N, which may be compared with a threshold. The threshold may be stored in a memory 1020.

Rate matching unit 1015 may separate the encoded data produced by turbo encoder 1010 into three streams: a systematic bit stream, Parity1 stream, and Parity2 stream. In addition to performing symbol separation, rate matching unit 1015 may also perform interleaving and grouping. The operation of rate matching unit 1015 may be as shown in FIGS. 2, 3, 8, and 9 discussed above.

Signal processing unit 1025 may provide additional signal processing on the encoded data provided by rate matching unit 1015 such as modulation, parallel-to-serial conversion, and so forth. Radio frequency (RF) circuitry 1030 may be used to process encoded data provided by signal processing unit 1025 for over-the-air transmission via one or more antennas. The processing performed by RF circuitry 1030 may include filtering and amplifying.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for transmitting information, the method comprising:
encoding a block of N bits, where N is an integer value;
demultiplexing the encoded block of N bits into at least one subblock of systematic bits and at least one subblock of parity bits;
permuting the at least one subblock of systematic bits and the at least one subblock of parity bits to generate at least one permuted subblock;
forming at least one output block from the at least one permuted subblock;
computing a starting position of a redundancy version for a hybrid automatic repeat request (HARQ) transmission according to a relationship between N and a threshold, wherein in accordance with the starting position, a predetermined number of systematic bits are skipped when N exceeds the threshold, and no systematic bits are skipped when N fails to exceed the threshold; and
transmitting the redundancy version, wherein the redundancy version begins at the computed starting position of the at least one output block and ends when a specified number of bits has been transmitted.

2. The method of claim 1, wherein the starting position enables a skipping of at least one systematic bit when N is greater than the threshold.

3. The method of claim 2, wherein computing the starting position comprises evaluating:

$$k_0 = R_{subblock}^{TC}\left(2\left\lceil \frac{N_{cb}}{8R_{subblock}^{TC}} \right\rceil \cdot rv_{idx} + \delta\right),$$

where $k_0$ is the computed starting position of the redundancy version for the HARQ transmission, $N_{cb}$ is the size of a buffer used to store the at least one permuted subblocks, $R_{subblock}^{TC}$ is the number of rows of an interleaver used to permute the at least one permuted subblocks, $rv_{idx}$ (which may be equal to 0, 1, 2, or 3) is an index of the redundancy version, and $\delta$ is a non-zero integer value.

4. The method of claim 1, wherein the starting position does not enable a skipping of any systematic bits when N is less than the threshold.

5. The method of claim 4, wherein the computed starting position is computed by evaluating:

$$k_0 = R_{subblock}^{TC}\left(2\left\lceil \frac{N_{cb}}{8R_{subblock}^{TC}} \right\rceil \cdot rv_{idx}\right),$$

where $k_0$ is the computed starting position of the redundancy version for the HARQ transmission, $N_{cb}$ is the size of a buffer used to store the at least one permuted subblocks, $R_{subblock}^{TC}$ is the number of rows of an interleaver used to permute the at least one permuted subblocks, and $rv_{idx}$ (which may be equal to 0, 1, 2, or 3) is an index of the redundancy version.

6. The method of claim 1, wherein the threshold is based on a code rate.

7. The method of claim 1, wherein permuting the at least one subblock of systematic bits and the at least one subblock of parity bits comprises:
interleaving the at least one subblock of systematic bits; and
interleaving the at least one subblock of parity bits.

8. The method of claim 7, wherein interleaving the at least one subblock of systematic bits and interleaving the at least one subblock of parity bits occur separately.

9. The method of claim 1, further comprising, permuting at least one of the at least one permuted subblocks.

10. The method of claim 9, wherein permuting at least one of the at least one permuted subblocks comprises, bit-shifting at least one of the at least one permuted subblocks.

11. The method of claim 10, wherein bit-shifting comprises, bit-shifting at least one of the at least one permuted subblocks in either a left or right direction.

12. A method for transmitting information, the method comprising:
encoding a first block of N bits received from a data input, thereby producing a first plurality of systematic bits, a first plurality of first parity bits, and a first plurality of second parity bits, where N is an integer value;
demultiplexing the encoded first block of N bits into a first subblock of systematic bits, a first subblock of first parity bits, and a first subblock of second parity bits;
permuting the first subblock of systematic bits, the first subblock of first parity bits, and the first subblock of second parity bits to generate a first permuted subblock;
generating a first output block from the first permuted subblock;
setting a first starting position of a first redundancy version for a hybrid automatic repeat request (HARQ) transmission to enable a skipping of at least one of the first systematic bits in response to determining that N is greater than a threshold;
setting the first starting position of the first redundancy version for the HARQ transmission to not enable a skipping of any of the first systematic bits in response to determining that N is less than the threshold; and
transmitting the first redundancy version by outputting at least a portion of the first output block starting at the first starting position.

13. The method of claim 12, further comprising:
encoding a second block of N bits, thereby producing a second plurality of systematic bits, a second plurality of first parity bits, and a second plurality of second parity bits;
demultiplexing the encoded second block of N bits into a second subblock of systematic bits, a second subblock of first parity bits, and a second subblock of second parity bits;
permuting the second subblock of systematic bits, the second subblock of first parity bits, and the second subblock of second parity bits to generate a second permuted subblock; and
generating a second output block from the second permuted subblock.

14. The method of claim 13, wherein transmitting the first redundancy version comprises, outputting the first output block starting at the first starting point and the second output block starting at the first starting point.

15. The method of claim 13, further comprising, permuting the second permuted subblock.

16. The method of claim 12, wherein the threshold is based on a code rate.

17. A transmitter comprising:
a segmentation unit coupled to a data input, the segmentation unit configured to generate data blocks of size N from data provided by the data input, where N is an integer value;
a turbo encoder coupled to the segmentation unit, the turbo encoder configured to encode a data block of size N to produce a plurality of systematic bits and a plurality of parity bits;
a rate matching unit coupled to the turbo encoder, the rate matching unit configured to permute the encoded data block of size N, form an output block from the permuted and encoded data block of size N, and to output the output block, wherein the outputted output block starts at a starting position based on a relationship between N and a threshold;
a signal processing unit coupled to the rate matching unit, the signal processing unit configured to modulate the outputted output block; and
a radio frequency circuit coupled to the signal processing unit, the radio frequency circuit configured to perform analog signal processing on the signal processed and outputted output block to prepare the signal processed and outputted output block for over-the-air transmission, wherein the rate matching unit comprises:
a symbol separation unit configured to separate the encoded data block of size N into at least one subblock of systematic bits and at least one subblock of parity bits;
a subblock interleaver coupled to the symbol separation unit, the subblock interleaver configured to interleave the at least one subblock of systematic bits and the at least one subblock of parity bits;
a symbol grouping unit coupled to the subblock interleaver, the symbol grouping unit configured to form at least one output block from an output of the subblock interleaver; and
a starting position unit coupled to the symbol grouping unit, the starting position unit configured to compute a starting position of a redundancy version for a hybrid automatic repeat request (HARQ) transmission based on a relationship between a size of a subblock and a threshold, wherein the starting position is computed such that no systematic bits are skipped if the size of the subblock fails to exceed the threshold.

18. The transmitter of claim 17, wherein the starting position is computed as $$k_0 = R_{subblock}^{TC}\left(2\left\lceil\frac{N_{cb}}{8R_{subblock}^{TC}}\right\rceil \cdot rv_{idx} + \delta\right)$$

if the size of a subblock is greater than the threshold, and the starting position is computed as $$k_0 = R_{subblock}^{TC}\left(2\left\lceil\frac{N_{cb}}{8R_{subblock}^{TC}}\right\rceil \cdot rv_{idx}\right)$$

if the size of a subblock is less than the threshold, where $k_0$ is the computed starting position of the redundancy version for the HARQ transmission, $N_{cb}$ is the size of a buffer used to store the at least one permuted subblocks, $R_{subblock}^{TC}$ is the number of rows of an interleaver used to permute the at least one permuted subblocks, $rv_{idx}$ (which may be equal to 0, 1, 2, or 3) is the index of the redundancy version, and $\delta$ is a non-zero integer value.

19. The transmitter of claim 17, wherein the subblock interleaver comprises a separate subblock interleaver for the at least one subblock of systematic bits and the at least one subblock of parity bits.

20. The transmitter of claim 17, wherein the threshold is based on a code rate of the turbo encoder.

* * * * *